United States Patent
Brennan et al.

(10) Patent No.: US 11,695,330 B2
(45) Date of Patent: Jul. 4, 2023

(54) METHOD TO REDUCE THE COMMON-MODE EMI OF A FULL BRIDGE CONVERTER USING SAMPLING COMMON-MODE FEEDBACK

(71) Applicant: Analog Devices International Unlimited Company, Limerick (IE)

(72) Inventors: Ciaran Brennan, Essex Junction, VT (US); Brian K. Jadus, Williston, VT (US); Keith W. Bennett, Grand Isle, VT (US)

(73) Assignee: Analog Devices International Unlimited Company, Limerick (IE)

( * ) Notice: Subject to any disclaimer, the term of this patent is extended or adjusted under 35 U.S.C. 154(b) by 941 days.

(21) Appl. No.: 16/567,253

(22) Filed: Sep. 11, 2019

(65) Prior Publication Data

US 2021/0075315 A1 Mar. 11, 2021

(51) Int. Cl.
*H02M 1/44* (2007.01)
*H02M 1/00* (2006.01)
(Continued)

(52) U.S. Cl.
CPC ........... *H02M 1/44* (2013.01); *H02M 1/0061* (2013.01); *H02M 1/08* (2013.01); *H02M 1/123* (2021.05);
(Continued)

(58) Field of Classification Search
CPC ........ H02M 1/44; H02M 1/0061; H02M 1/08; H02M 1/123; H02M 7/219; H02M 7/5387;
(Continued)

(56) References Cited

U.S. PATENT DOCUMENTS

| 4,597,026 A | * | 6/1986 | Santurtun | ........... | H02M 3/3376 |
| | | | | | 361/88 |
| 6,304,473 B1 | * | 10/2001 | Telefus | ................. | H02M 3/156 |
| | | | | | 363/21.04 |

(Continued)

FOREIGN PATENT DOCUMENTS

| CN | 105007079 | 4/2013 |
| CN | 206363743 | 7/2017 |

(Continued)

OTHER PUBLICATIONS

Zhang, Kai, "Reduction of Common Mode EMI in a Full-Bridge Converter through Automatic Tuning of Gating Signals", CES IEEE 5th International Power Electronics and Motion Control Conference, Shanghai, (Aug. 2006), 5 pgs.

(Continued)

*Primary Examiner* — Yusef A Ahmed
(74) *Attorney, Agent, or Firm* — Schwegman Lundberg & Woessner, P.A.

(57) ABSTRACT

A switched power circuit to control a common-mode signal. The switched power circuit includes a first switch and a second switch configured to generate switch mode voltage between a first node and a second node. The switched power circuit further includes a feedback circuit that is configured to detect common-mode voltage generated between the first node and the second node by a first signal generated by the first switch and a second signal generated by the second switch, and incrementally adjust a timing parameter of the first signal to adjust the common-mode signal.

15 Claims, 9 Drawing Sheets

(51) Int. Cl.
   *H02M 7/219* (2006.01)
   *H02M 7/5387* (2007.01)
   *H02M 1/12* (2006.01)
   *H02M 1/08* (2006.01)
   *H02M 3/335* (2006.01)
   *H03K 17/16* (2006.01)

(52) U.S. Cl.
   CPC ......... *H02M 3/3353* (2013.01); *H02M 7/219* (2013.01); *H02M 7/5387* (2013.01); *H03K 17/166* (2013.01); *H02M 1/0003* (2021.05); *H02M 1/0012* (2021.05); *H02M 1/0025* (2021.05)

(58) Field of Classification Search
   CPC .............. H02M 1/0003; H02M 1/0012; H02M 1/0025; H02M 3/155–1588; H03K 17/166
   See application file for complete search history.

(56) References Cited

U.S. PATENT DOCUMENTS

| | | | | |
|---|---|---|---|---|
| 6,396,250 | B1* | 5/2002 | Bridge | H03K 17/165 323/283 |
| 6,448,807 | B1* | 9/2002 | Ahsanullah | H03K 17/164 326/26 |
| 6,483,724 | B1* | 11/2002 | Blair | H02M 1/44 363/17 |
| 6,664,822 | B2* | 12/2003 | Watabe | H02M 7/538 327/333 |
| 6,958,592 | B2* | 10/2005 | Chapuis | H02M 1/38 323/284 |
| 7,061,775 | B2 | 6/2006 | Beihoff et al. | |
| 7,098,640 | B2* | 8/2006 | Brown | H02M 3/1588 323/283 |
| 7,391,194 | B2* | 6/2008 | Brown | H02M 1/38 323/283 |
| 7,423,894 | B2* | 9/2008 | Ilic | H02M 3/1584 363/132 |
| 7,619,910 | B2 | 11/2009 | Hesterman et al. | |
| 8,004,330 | B1* | 8/2011 | Acimovic | H03K 19/00361 327/170 |
| 9,024,606 | B2* | 5/2015 | Adell | H02M 3/1588 323/283 |
| 9,048,756 | B2 | 6/2015 | Dong et al. | |
| 9,425,785 | B1* | 8/2016 | Wibben | H03K 17/165 |
| 9,537,383 | B1* | 1/2017 | Wibben | H02M 1/38 |
| 9,825,560 | B2 | 11/2017 | Li et al. | |
| 10,063,143 | B1* | 8/2018 | Fan | H02M 5/458 |
| 10,461,644 | B1* | 10/2019 | Gong | H02M 3/1582 |
| 2004/0136209 | A1* | 7/2004 | Hosokawa | H02M 3/3376 363/24 |
| 2011/0018516 | A1* | 1/2011 | Notman | H02M 3/1588 323/284 |
| 2012/0147629 | A1* | 6/2012 | Mao | H02M 3/28 363/17 |
| 2013/0265018 | A1* | 10/2013 | Yamanoue | H02M 3/158 323/271 |
| 2015/0222193 | A1* | 8/2015 | Zambetti | H02M 1/08 363/21.02 |
| 2015/0311795 | A1* | 10/2015 | Yang | H02M 3/156 323/271 |
| 2015/0333630 | A1* | 11/2015 | Pastore | H02M 1/4258 363/21.17 |
| 2015/0349636 | A1* | 12/2015 | Bodano | H02M 1/32 323/271 |
| 2015/0365097 | A1* | 12/2015 | Jadus | H03M 1/1255 323/281 |
| 2017/0012618 | A1* | 1/2017 | Krishna | H03K 17/166 |
| 2017/0063251 | A1* | 3/2017 | Ye | H02M 3/33576 |
| 2017/0099001 | A1* | 4/2017 | Cardu | H02M 3/33592 |
| 2017/0099002 | A1* | 4/2017 | Trevisan | H02M 3/3376 |
| 2018/0034322 | A1* | 2/2018 | Tanji | B60L 53/122 |
| 2020/0186047 | A1* | 6/2020 | Sen | G01R 19/2509 |
| 2020/0195160 | A1* | 6/2020 | Mayell | H02M 3/33592 |
| 2021/0288576 | A1* | 9/2021 | Rizzolatti | H02M 1/007 |
| 2022/0069713 | A1* | 3/2022 | Khamesra | H02M 1/0048 |

FOREIGN PATENT DOCUMENTS

| | | |
|---|---|---|
| TW | 201114179 | 4/2011 |
| TW | 201642585 | 12/2016 |
| TW | 201911749 | 3/2019 |
| TW | I774054 B | 8/2022 |
| WO | 2021047871 | 3/2021 |

OTHER PUBLICATIONS

"International Application Serial No. PCT/EP2020/073260, International Search Report dated Nov. 12, 2020", 5 pgs.

"International Application Serial No. PCT/EP2020/073260, Written Opinion dated Nov. 12, 2020", 7 pgs.

"Taiwanese Application Serial No. 109131092, Office Action dated May 26, 2021", w/ English Translation, 17 pgs.

"European Application Serial No. 20760443.0, Response to Communication pursuant to Rules 161 and 162 filed Oct. 8, 2022", 14 pgs.

"International Application Serial No. PCT/EP2020/073260, International Preliminary Report on Patentability dated Mar. 24, 2022", 7 pgs.

\* cited by examiner

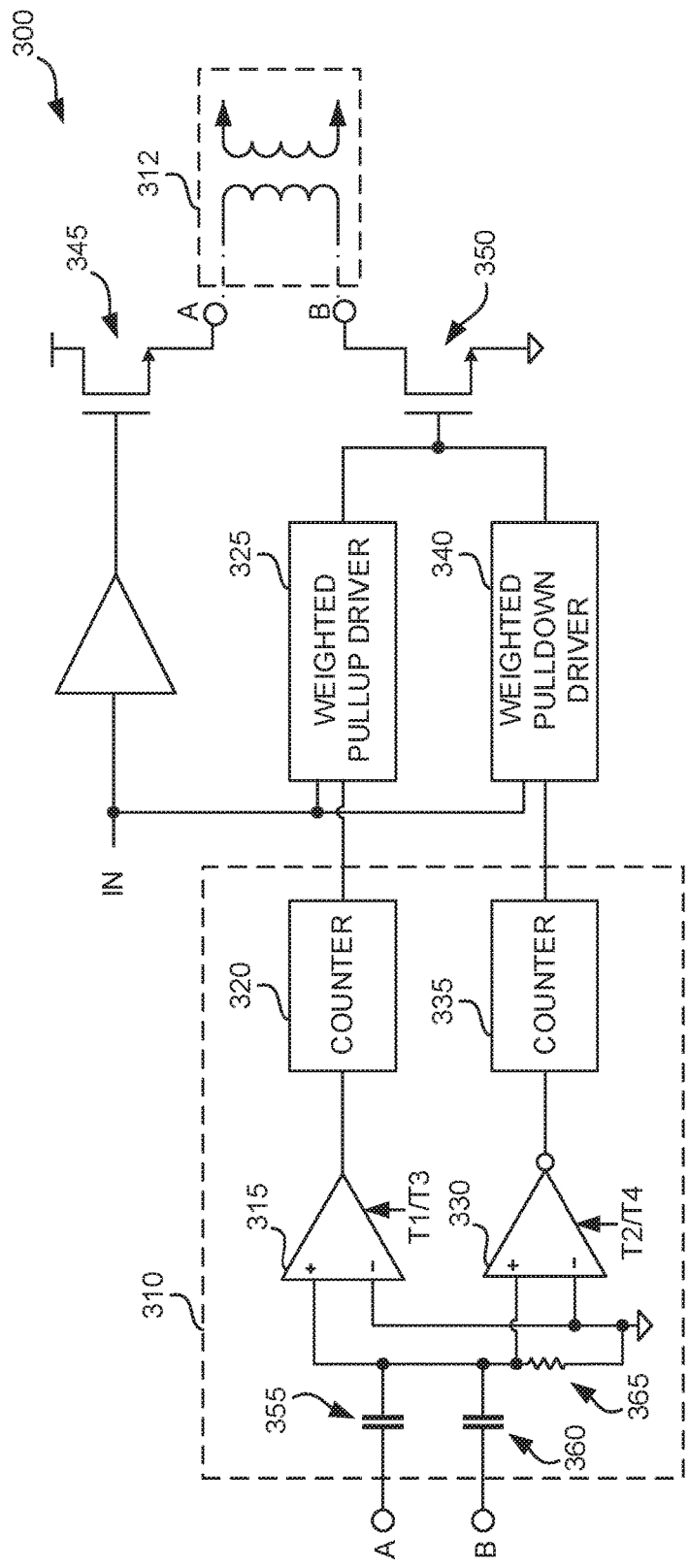
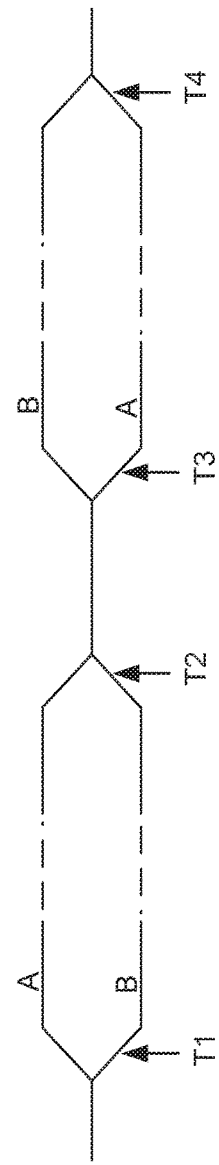
FIG. 3A
FIG. 3B

METHOD TO REDUCE THE COMMON-MODE EMI OF A FULL BRIDGE CONVERTER USING SAMPLING COMMON-MODE FEEDBACK

FIELD OF THE DISCLOSURE

This document pertains generally, but not by way of limitation, to power converters, and more particularly, to reducing electromagnetic interference in switch mode power converters.

BACKGROUND

Modern electronic devices rely on power supplies that can be required to satisfy stringent efficiency, size, and reliability constraints. Such devices often use switch mode power supplies, such as bridge converters, because they can convert power from one form to another form more efficiently than linear power supplies. The efficiency of switch mode power supplies can be attributed in part to the capability of these power supplies to operate at relatively high frequencies due to the availability of solid-state devices, such as MOSFET and IGBTs, that can be rapidly switched with short rise times and fall times. Additionally, the ability to operate switch mode power supplies at high frequencies means that the passive elements of these power supplies, such as capacitors or inductors, can be made smaller for given operating targets, thereby enabling such power supplies to be manufactured at reduced sizes and costs relative to their linear counterparts. High frequency operation of switch mode power supplies, however, can amplify the effects of circuit board parasitics or mismatches between switching elements and other components. At high switching frequencies, such circuit board parasitics and component mismatches can cause transient currents that can generate unwanted electromagnetic interference (EMI). Such EMI can reduce the reliability of switch mode power supplies by damaging constituent elements or causing the power supply to interfere with the operation of other devices.

BRIEF DESCRIPTION OF THE DRAWINGS

FIG. 3A depicts a diagram of an example of a device that is configured to reduce common-mode electromagnetic interference using sampling feedback and incremental control of a weighted gate driver, according to various examples.

FIG. 3B depicts a diagram of waveforms associated with the operation of a device that is configured to reduce common-mode electromagnetic interference using sampling feedback and incremental control of a weighted gate driver, according to various examples.

Figure 1:
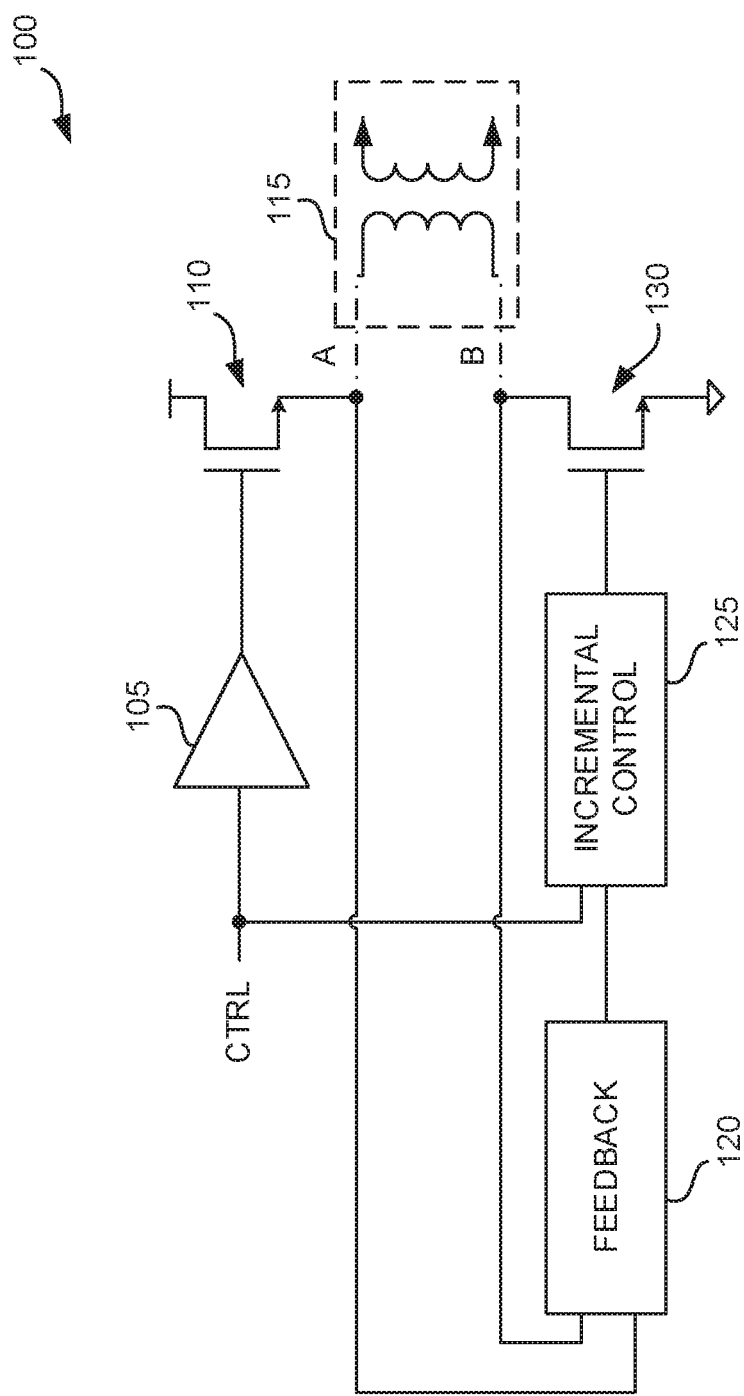
FIG. 1 depicts a diagram of an example of a device that is configured to reduce common-mode electromagnetic interference using sampling feedback and incremental control, according to various examples.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present disclosure includes circuits and techniques that reduce common-mode electromagnetic interference (EMI) in switch mode power circuits, such as by adjusting slew rate, delay, or other timing parameters of the switching elements through direct measurement of common-mode voltages and incremental sampling feedback control of switching operations. Switch mode power circuits constructed according to the techniques described herein can operate at high frequencies while generating reduced common-mode EMI as compared with power circuits that are constructed according to other techniques.

Aspects of the present disclosure focus on circuits and techniques to reduce common-mode EMI in full-bridge power converter circuits. Such circuits and techniques, however, can be used to reduce common-mode EMI in any switching power circuits or power supplies where such EMI is caused by common-mode signals that are generated due to timing mismatches between switching elements.

Aspects of the present disclosure discuss adjusting one or more timing parameter(s) of a signal. Such timing parameters can include a delay in the start of a transition in the signal from a first state or signal value to a second state or signal value. Such time parameters can also include a slew rate, a rise time, a fall time, or any other timing related characteristic or property of a signal. Adjusting a timing parameter of a signal can include, or may be equivalent to, adjusting a timing parameter of a switch that sources, shapes, modifies, or otherwise generates the signal. A timing parameter of a switch can include any time related characteristic or property associated with the actuation or control of a switch.

The present disclosure uses the terms switch, switching device, or switching element synonymously. A switch, switching device, or switching element can include one or more electronically-controlled switches such as an electromechanical switch, transistor, or other controllable semiconductor device.

FIG. 1 depicts a diagram of an example of a device 100 that is configured to reduce common-mode electromagnetic interference using sampling feedback and incremental control, according to various examples. The device 100 can represent a general application of a switch mode power circuit that is configured to convert an input power supply to a form that is appropriate for an indicated application. Such conversion can include using controlled switching of an active element to modify the power delivered to an inductive element. In some examples, the device 100 can be a component of a switch mode power supply (SMPS) or circuit, such as a half-bridge converter, a full-bridge converter, or three-phase bridge. Uncontrolled variation in the switch times of the switching elements can cause errors in the output power generated by these devices. In a bridge rectifier, for example, differences in the switching times of paired or synchronous switching elements can cause timing errors that manifest as common-mode EMI. Such common-mode EMI can damage components of a SMPS or a load circuit and may disrupt the operation of other devices. The device 100 can be used to, among other things, detect errors or other variations in a timing parameter of a first switching element relative to a timing parameter of a second switching element, and use this information to incrementally adjust (e.g., up or down) the timing parameter of the first switching element.

The device 100 can include a drive circuit 105, a switching element 110, an inductive element 115, a feedback circuit 120, an incremental control element 125, and a switching element 130. The switching element 110 and the switching element 130 can include any electrically controllable electronic switching device, such as a field effect transistor (FET), an insulated-gate bipolar transistor (IGBT), and bipolar junction transistor (BJT). In some embodiments, such switching elements can include other switching devices, such as electromechanical switches.

The inductive element 115 can include one or more inductors or transformers. The drive circuit 105 can include a gate driver circuit that is configured to drive the switching element 110 based on input control signal CTRL. The feedback circuit 120 can include a circuit that is configured to sample a signal (e.g., an electrical signal) and compare the signal to another signal. The feedback circuit 120 can also include a memory circuit to incrementally update a numeric indicator of the difference between the two signals. In some examples, the memory circuit can be a counter circuit. In some examples, the feedback circuit can be configured to periodically sample a signal and incrementally update the numeric indicator, such as incrementing or decrementing a value stored in a counter circuit. The incremental control circuit 125 can include digitally controlled driver circuit, such as a binary weighted gate driver circuit or a binary weighted delay line circuit.

In operation, the driver circuit 105 can drive the switching element 110 while the incremental control circuit 125 drives the switching element 130. In some examples, the driver circuit 105 and the incremental control circuit 125 are configured to synchronously switch the switching element 110 and switching element 130 based on the input control signal CTRL, such as to periodically generate a signal at node A and node B to charge or discharge the inductive element 115.

In an ideal implementation of the device 100, the switching element 110 and the switching element 130 can have substantially similar timing parameters and can be switched at the same time, such as to generate signals at node A and node B that are anti-symmetric. The anti-symmetric signals at node A and node B can have substantially similar timing parameters, such that the signals have identical start times or delays, equal and opposite slew rates, equal and opposite changes in voltage amplitude, and equal rise and fall times. These anti-symmetric signals can operate to cause the common-mode voltage developed in the inductive element 115 to be substantially constant. A constant common-mode voltage means that little or no common-mode EMI is generated in this scenario.

In a practical implementation of the device 100, however, there can be a difference between the timing parameters or switch times of the switching element 110 and the switching element 130. Such difference in timing parameters or switch times can cause differences in the signals that are generated at node A and node B. The differences can cause high frequency variations in the common-mode voltage developed in the inductive element 115. These high frequency variations can contribute to common-mode IMI and can be coupled or radiated to other circuits.

The device 100 can use the feedback circuit 120 to substantially reduce the common-mode EMI caused by timing differences in signals generated at node A and node B, such as caused by timing differences between the switching element 110 and the switching element 130. Such common-mode EMI can be reduced by using the feedback circuit 120 to automatically adjust a timing parameter of one or more of these signals or switches. In an example, the feedback circuit 120 can detect, or sample, a voltage at node A and a voltage at node B during each switching cycle of the device 100. The feedback circuit 120 can then compare the sampled voltages and incrementally update a binary or other numeric indicator (hereinafter, binary indicator), such as a value stored in a counter or other memory circuit, based on the comparison. In an example, the feedback circuit 120 can increment a counter in response to determining that the voltage at node A has a faster rise time than the voltage at node B, or the feedback circuit can decrement the counter in response to determining that the voltage at node A has a slower rise time than the voltage on node B. The feedback circuit 120 can update the binary indicator at least once during each switching cycle based on differences in the rise time, fall time, slew rate, delay, amplitude, or any other measurable timing parameter of the sampled signal at node A or node B. In some examples the feedback circuit 120 can update the binary or numeric indicator during each switching period based on differences between a measurable parameter of a reference signal and sampled signal, such as a signal sampled at node A or node B. The value of the binary indicator can be provided to the incremental control circuit 125.

In some examples, the incremental control circuit 125 can use the value of the binary indicator received from the feedback circuit 120 to incrementally update a timing parameter of the signal at node B or, equivalently, a timing parameter of the switching element 130. Such updating can include increasing or decreasing the switching delay of switching element 130, or adjusting the drive strength, modulation, or signal profile of the control signal used to drive switching element 130. Incrementally adjusting the timing parameter of the signal at node B or the timing parameter of the switching element 130 based on the feedback provided by feedback circuit 120 enables the device 100 to incrementally reduce the symmetry destroying signal difference between node A and node B, thereby incrementally reducing common-mode EMI.

In some examples, the incremental control circuit 125 can be used to control the switching element 110 instead of, or in addition to, controlling the switching element 130.

In some examples, the inductive element 115 can be a transformer, and the switching element 110 and the switching element 130 can be configured to drive the primary winding or the secondary winding of the transformer.

The system shown in FIG. 1 and the description of the system is generally applicable to the systems and process shown in FIGS. 2-8.

Figure 2:
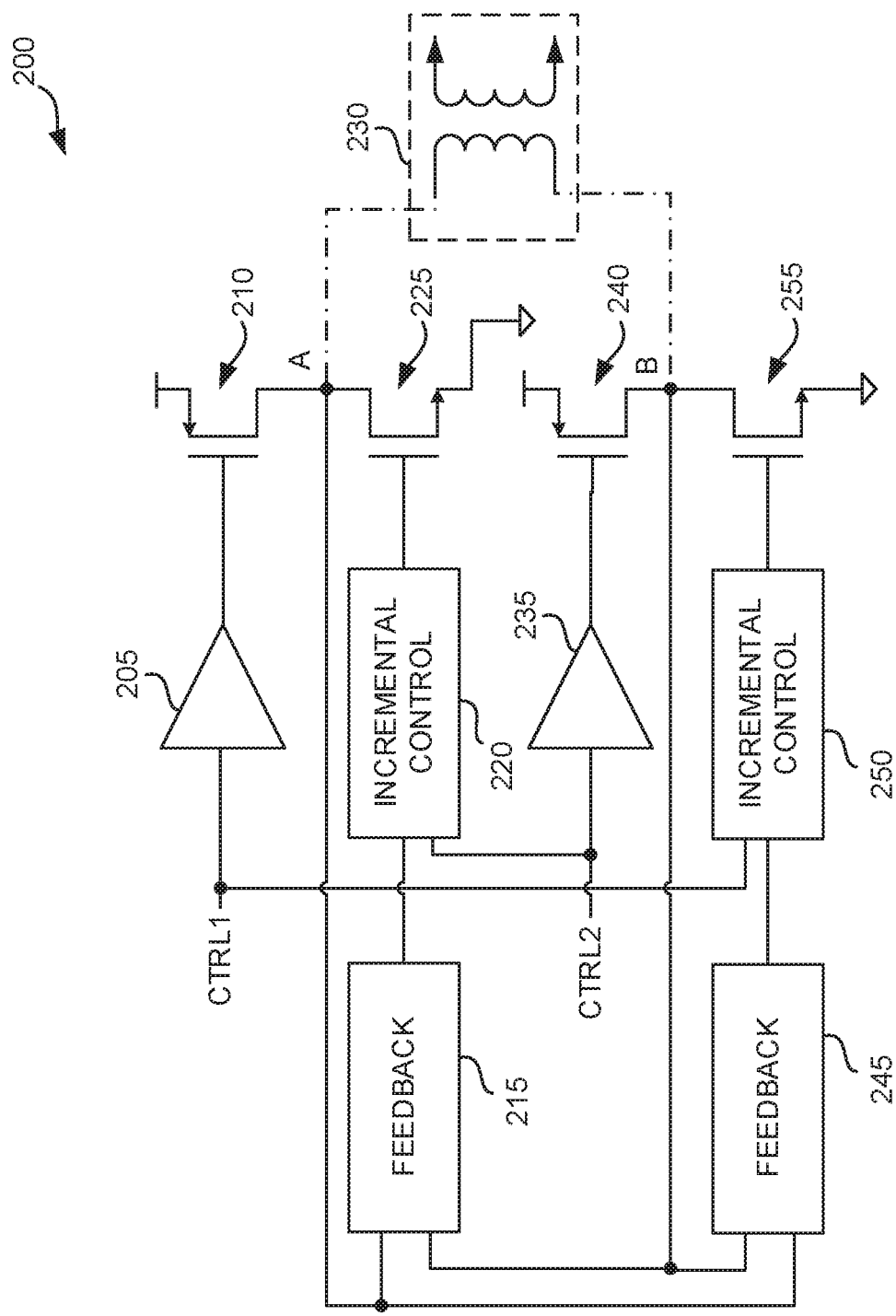
FIG. 2 depicts a diagram of an example of a device that is configured to reduce common-mode electromagnetic interference using sampling feedback and incremental control, according to various examples.

FIG. 2 depicts a diagram of an example of a circuit or device 200 that is configured to reduce common-mode electromagnetic interference using sampling feedback and incremental control, according to various examples. The device 200 can be an implementation of device 100 (FIG. 1) that is expanded to illustrate the use of sampling feedback and incremental control to both phases of a bridge driver, Although the device 200 shows the incremental control circuit 220 and the incremental control circuit 250 driving pulldown switch 225 and pulldown switch 255, respectively, the incremental control circuits can be used to control any, combination of the switches 210, 225, 240, or 255 to reduce common-mode EMI caused by variations in common-mode voltages developed in the inductive element 230.

In operation, the driver circuit 205 and the incremental control circuit 250 can synchronously actuate the switch 210 and the switch 255 based on input control signal CTRL1. Similarly, the incremental control circuit 220 and the driver circuit 235 can synchronously actuate the switch 225 and the switch 240 based on input control signal CTRL2. During a first half of a switching cycle, such as when switch 210 and switch 255 turned on or are in the process of turning on, the feedback circuit 245 can sample the signals at nodes A and node B, and incrementally update a stored value of a binary indicator (e.g., a counter) that is provided to incremental control circuit 250, so as to incrementally adjust a timing parameter of the switch 255 to reduce timing differences (e.g., differences in timing parameters) between the switch 210 and the switch 255. Similarly, during a second half of a switching cycle, such as when switch 225 and switch 240 are turned on or are in the process of turning on, the feedback circuit 215 can sample the signals at node A and node B, and incrementally update a stored value of the binary indicator provided to incremental control circuit 220, so as to incrementally adjust a timing parameter of the switch 225 to reduce timing differences between the switch 225 and the switch 240.

FIG. 3A depicts a diagram of an example of a device 300 that is configured to reduce common-mode electromagnetic interference using sampling feedback and incremental control of a weighted gate driver circuit 325 or 340, according to various examples. The device 300 can include an example of the device 100 (FIG. 1). In some examples the device 300 can include an example of the positive drive phase of the bridge converter shown in FIG. 2. The circuit for the negative drive phase of the bridge converter shown in FIG. 2 can include a circuit that is substantially similar to the circuit for the positive drive phase. The device 300 can include a weighted pullup driver 325 that is configured to incrementally adjust the rising slew rate of the switch 350, such as during the first half of a switching cycle of the device 300. The device 300 can also include a weighed pulldown gate driver 340 that is configured to adjust the falling slew rate of the switch 350, such as during a second half of a switching cycle of the device 300. The device 300 can additionally include a feedback circuit 310.

In some examples the weighted pullup gate driver 325 or the weighted pulldown gate driver 340 can include a drive switch or transistor that has an adjustable effective width. Such weighted gate drivers can adjust the slew rate of the switch 350 by using a binary value to adjust the width of the adjustable drive switches, thereby controllably adjusting the amount of current supplied by such adjustable drive switches.

The feedback circuit 310 can include a coupling network formed by, resistor 365 and capacitors 355 and 360, such as to couple alternating current (AC) common-mode signals to the feedback circuit from node A and node B. The feedback circuit 310 can further include comparators 315 and 330, and counters 320 and 335. The comparators 315 and 330 can include any comparison circuit that is configured to compare the AC coupled common-mode signal. The counter 320 and the counter 335 can include an up-down counter or similar counting or memory circuit. In some examples, the feedback circuit 310 can also include a timing network (not shown) to generate timing control signals T1, T2, T3 and T4 to control the operation of the comparators 315 and 330.

In operation, the feedback circuit 310 can sample variations in the common-mode voltage (hereinafter, common-mode errors) developed in the inductive element 312 at node A and node B. Such common-mode errors can be caused by differences in delay and slew rate of the switches 345 and 350. The feedback circuit 310 can also incrementally adjust the slew rate of the gate voltage applied to switch 350 to reduce the common-mode errors.

FIG. 3B depicts a diagram of waveforms associated with the operation of the device 300. To evaluate the operation of the device 300 in view of the waveforms depicted in FIG. 3B, assume that the common-mode error sampled by the feedback circuit 310 is positive at time T1, such as when the switch 350 is being turned on. This positive common-mode error can indicate that the switch 345 is turning on faster than the switch 350. The positive common-mode error can cause comparator 315 to generate a positive output. The positive output of comparator 315 can be used to increment the value of the counter 320. The incremented counter value can then be coupled to the weighted pullup driver 325, thereby causing the pullup driver to increase the current used to drive the gate of switch 350. This increase in current can increase the slew rate of the voltage on the gate of switch 350, thereby turning on the switch faster. This process can continue in one or more switching cycles until switch 350 turns on as fast as switch 345 and the common-mode error at T1 is close to zero.

Next, assume the common-mode error sampled by the feedback circuit 310 is positive at time T2, such as when switch 350 is being turned off. This positive common-mode error can indicate that switch 350 is turning off faster than switch 345, resulting in a positive common-mode error. The positive common-mode error can cause comparator 330 to generate a negative output, such as a positive output which is then inverted to be negative. The negative output of comparator 330 can be used to decrement the value of the counter 335. The decremented counter value can be coupled to the weighted pulldown driver 340, thereby causing the weighted pulldown driver 340 to decrease the current used to drive the gate of the switch 350. This decreased current can decrease the slew rate of the turn-off voltage at the gate of the switch 350, thereby causing the switch to turn off at a slower rate. This process can continue in one or more switching cycles until switch 350 turns off as slow as switch 345 and common-mode error at T2 is close to zero.

A substantially similar circuit to the circuit shown in the device 300 can be used to perform the same feedback function for the negative phase of the switching cycle. In such a circuit, the negative rising edge of a switch mode signal, such as the signal at node A or node B, is sampled at T3 and the negative falling edge sampled at T4 and compared. The results of the comparison can be used to adjust the pullup or pulldown drive current applied to the gate of, for example, switch 225 (FIG. 2).

Using common-mode feedback that controls the slew rate of the current used to drive the gate for the pulldown switch 350 or 225 can change the delay or slew rate of the signals at node A and node B, with increasing gate drive current producing shorter delays and greater output slew rate. This technique uses fewer components than other techniques and can therefore be a cost-effective technique to reduce the common-mode voltage variations in an integrated circuit full-bridge converter. Other techniques can include:

1. Varying the delay instead of the predrive current, such as the current used to drive the gate for the pulldown switch 350 or 225, of each transition based on a single CM voltage comparison during each transition (FIG. 3)
2. Varying both the delay and slew rate based on two common-mode voltage comparisons during each transition (e.g., each half of a switching cycle), with the first comparison controlling the delay, and the second controlling the slew rate.
3. Varying the delay and/or the slew rate of the pullup switches 345 and 240 instead of, or in addition to varying the delay and/or the slew rate of the pulldown switches 225 and 350.
4. Employing DC CM feedback.
5. Equalizing the on state common-mode voltage by varying the control voltage or the active device width of one or more of the drive transistors.
6. Reducing common-mode noise on the secondary side of the transformer by adjusting the delay, slew rate, or amplitude of the synchronous rectifier switches.

Figure 4A:
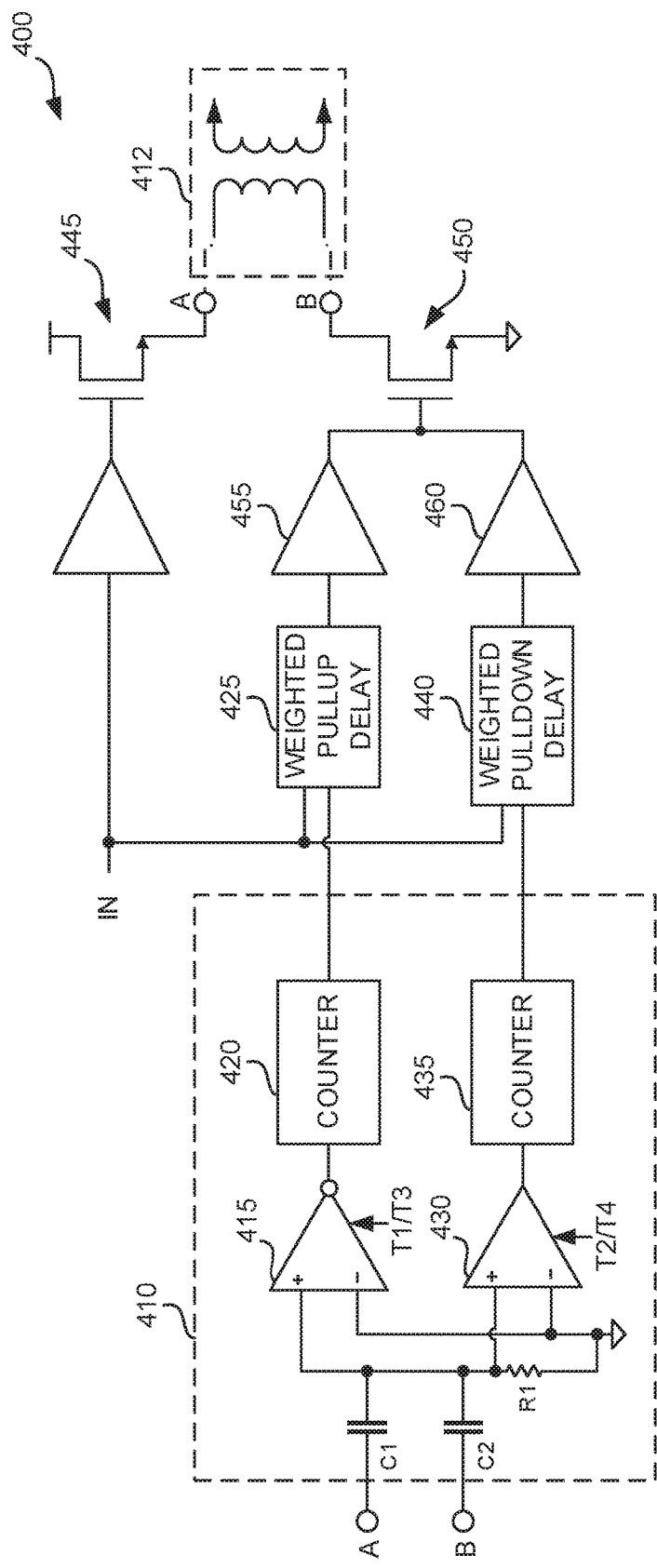
FIG. 4A depicts a diagram of an example of a device that is configured to reduce common-mode electromagnetic interference using sampling feedback and incremental control of a weighted delay circuit, according to various examples.
Figure 4B:
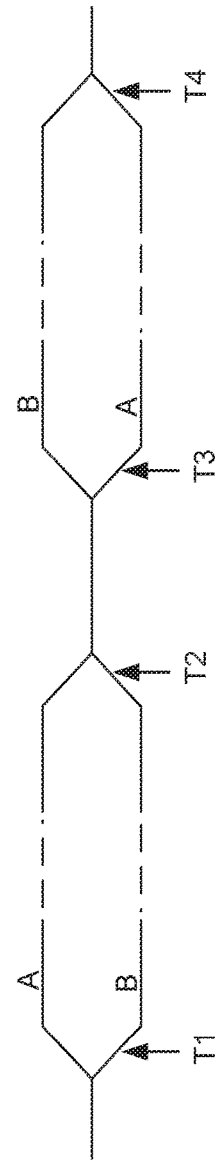
FIG. 4B depicts a diagram of waveforms associated with the operation a device that is configured to reduce common-mode electromagnetic interference using sampling feedback and incremental control of a weighted delay circuit, according to various examples.

FIG. 4A depicts a diagram of an example of a device 400 that is configured to reduce common-mode electromagnetic interference using sampling feedback and incremental control of a weighted delay circuit, according to various examples. The device 400 can be an example of an implementation of the device 300, configured such that the weighted delay drivers 325 and 340 are replaced by weighted delay circuits 425 and 440, respectively. Gate drivers 455 and 460 are also shown. FIG. 4B depicts a diagram of waveforms associated with the operation the device 400.

To evaluate the operation of the device 400 in view of the waveforms depicted in FIG. 4B, assume that the common-mode error at the inductive element 412 is positive at time T1, such as when switch 450 is being turned on. This can indicate that switch 445 was actuated, or driven to turn on, before the switch 450, resulting in a positive common-mode error. The positive common-mode error can be coupled to the feedback circuit 410 to cause comparator 415 to generate a negative output after inversion. The negative output of comparator 415 can be used to decrement the value of the counter 420. The decremented counter value can be coupled to the weighted delay circuit 425 where it can used to decrease the delay in in actuating the switch 450, causing the switch the turn on earlier in time. This process can continue in each switching cycle until switch 450 is actuated, or turned on, at substantially the same time that the switch 445 is actuated and the common-mode error at T1 approaches zero.

Next, assume the common-mode error is positive at time T2, such as when switch 450 is being turned off. This can indicate that switch 450 is being actuated, or driven, to turn off earlier than switch 445, resulting in a positive common-mode error. The positive common-mode error can be coupled to the feedback circuit 410 to cause comparator 430 to generate a positive output. The positive output of comparator 430 can be used to increment the value of the counter 435. The incremented counter value can be coupled to the weighted delay circuit 440 where it can be used to actuate the switch 450 at a later time. This process can continue in each switching cycle until switch 450 is actuated, or turned off, at substantially the same time that the switch 445 is actuated and the common-mode error at T2 approaches zero.

Figure 5:
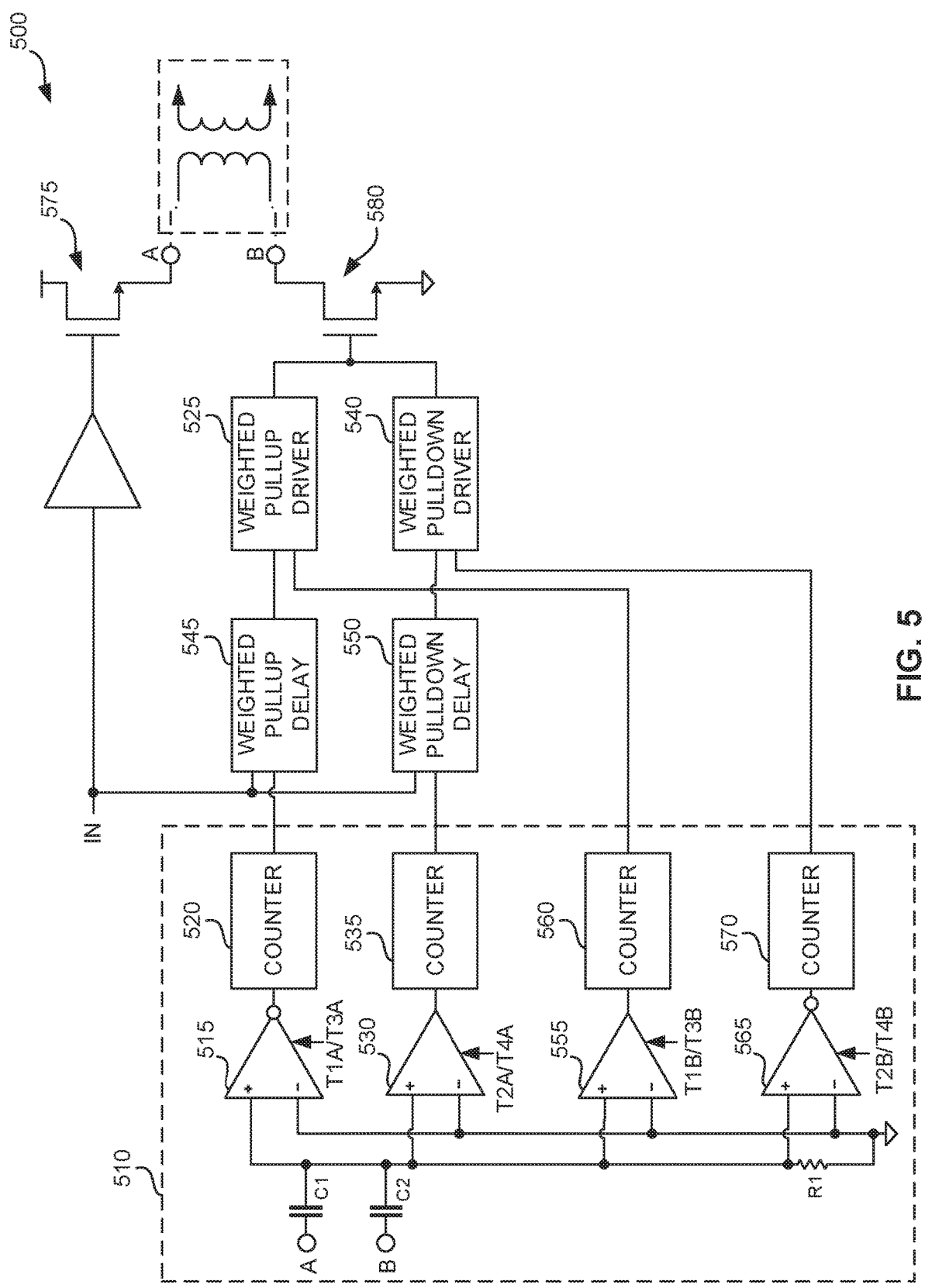
FIG. 5 depicts a diagram of an example of a device that is configured to reduce common-mode electromagnetic interference using sampling feedback and incremental control of a weighted delay circuit and a weighted gate driver, according to various examples.
Figure 6:
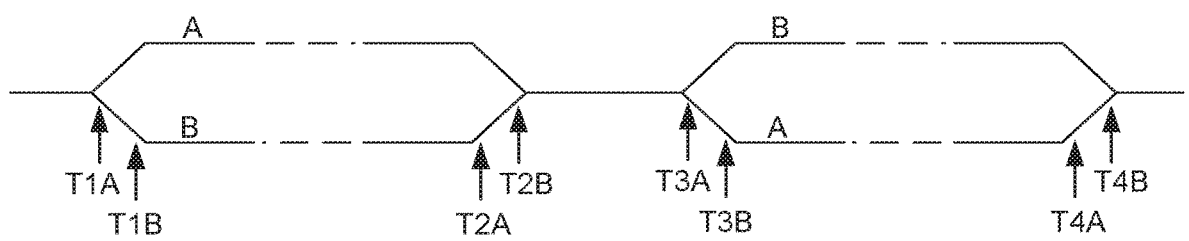
FIG. 6 depicts a diagram of waveforms associated with the operation a device that is configured to reduce common-mode electromagnetic interference using sampling feedback and incremental control of a weighted delay circuit and a weighted gate driver, according to various examples.

FIG. 5 depicts a diagram of an example of a device 500 that is configured to reduce common-mode electromagnetic interference using sampling feedback and incremental control of weighted delay circuits 545 and 550 and weighted gate driver circuits 525 and 540, according to various examples. The device 500 can be an example of a combined implementation of the device 300 (FIG. 3) and the device 400 (FIG. 4). FIG. 6 depicts a diagram of waveforms associated with the operation of the device 500.

Similar to the operation of the device 300, the feedback circuit 510 samples common-mode error at node A and node B at times T1B and T2B. The sampled common-mode error is coupled to the comparators 555 and 565 which update the counters 560 and 570 based on the polarity of the common-mode error. The updated counter values are then used to adjust the pullup or pulldown current applied to the gate of switch 580, such as to adjust the slew rate of the switch 580 to match the slew rate of the switch 575.

Similar to the operation of the device 400, the feedback circuit 510 samples common-mode error at node A and node B at times T1A and T2A. The sampled common-mode error is coupled to the comparators 515 and 530. The comparators 515 and 530 incrementally update the counters 520 and 535 based on the polarity of the common-mode error. The updated counter values are then used to adjust the actuation, or turn-on and turn-off, delay of switch 580 to match the turn-on time or the turn-off time of the switch 575.

Figure 7:
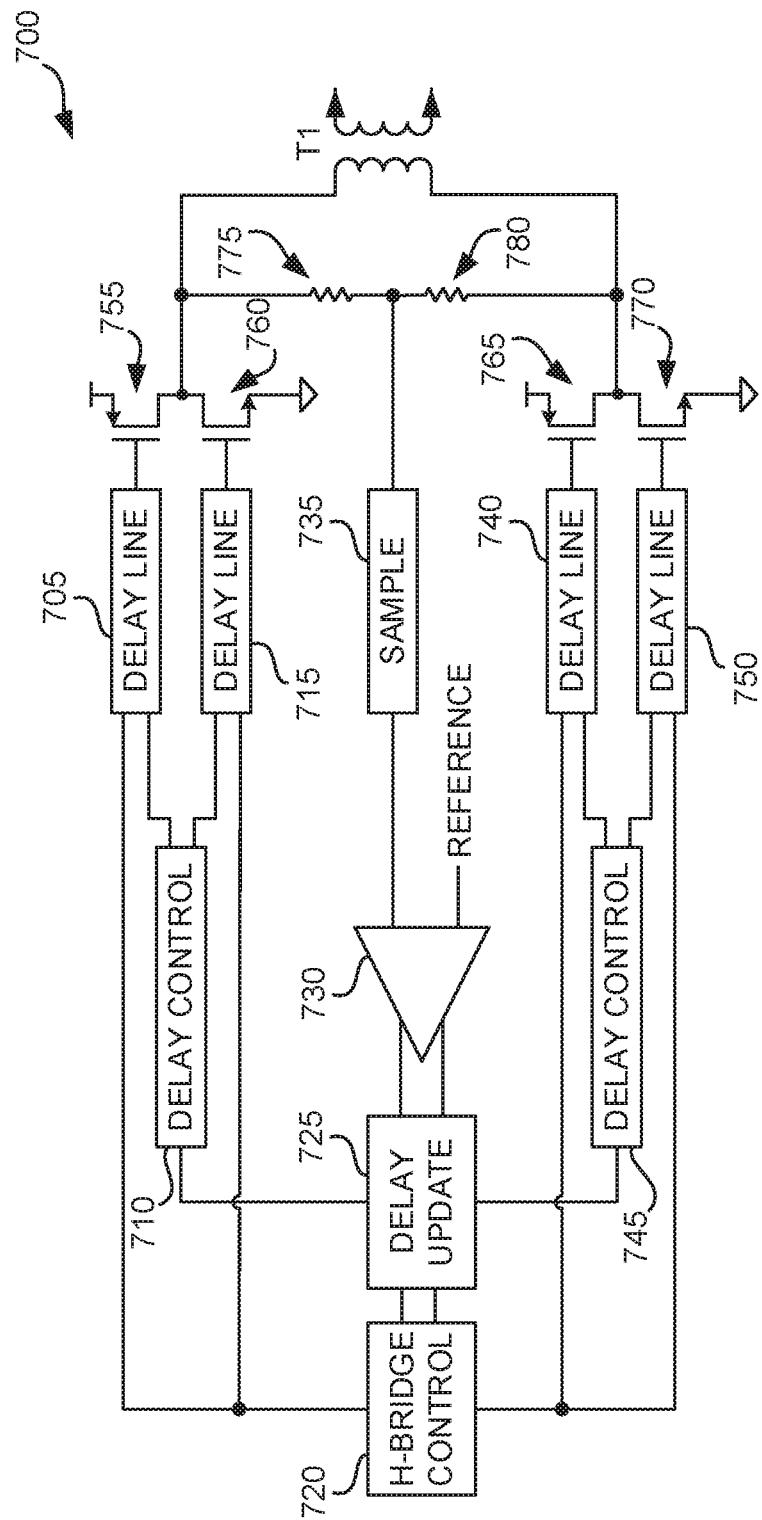
FIG. 7 depicts a diagram of an example of a device that is configured to reduce common-mode electromagnetic interference by varying delay of switching transitions, according to various examples.

FIG. 7 depicts a diagram of an example of a device 700 that is configured to reduce common-mode electromagnetic interference by controlling the delay of switching transitions in a switching power circuit, according to various examples. The device 700 can include an example of an implementation of the device 100 (FIG. 1).

In operation, the delay line circuit 705 and the delay line circuit 750 can synchronously actuate the switch 755 and the switch 770 under control of the H-Bridge control circuit 720. Similarly, the delay line circuit 715 and the delay line circuit 740 can synchronously actuate the switch 760 and the switch 765 under control of the H-Bridge control circuit 720. During a first half of a switching cycle of the device 700, such as when switch 755 and switch 770 are turned on or are in the process of turning on, the common-mode voltage in the primary winding of transformer T1 can be direct current (DC) coupled to sample and hold circuit 735 through the resistor network formed by resistors 775 and 780. The comparator 730 can compare the sampled DC common-mode voltage to the reference signal REFERENCE and provide an indication of whether the DC common-mode voltage is higher or lower than the reference signal. Delay update circuit 725 can then incrementally adjust the amount of delay provided by delay line circuits 705, 715, 740, or 750 based on the output of the comparator 730 to update the actuation, or turn-on or turn-off, times of the switches 755, 760, 765, or 770 to reduce a different the difference between the sampled common-mode voltage and the reference signal.

Figure 8:
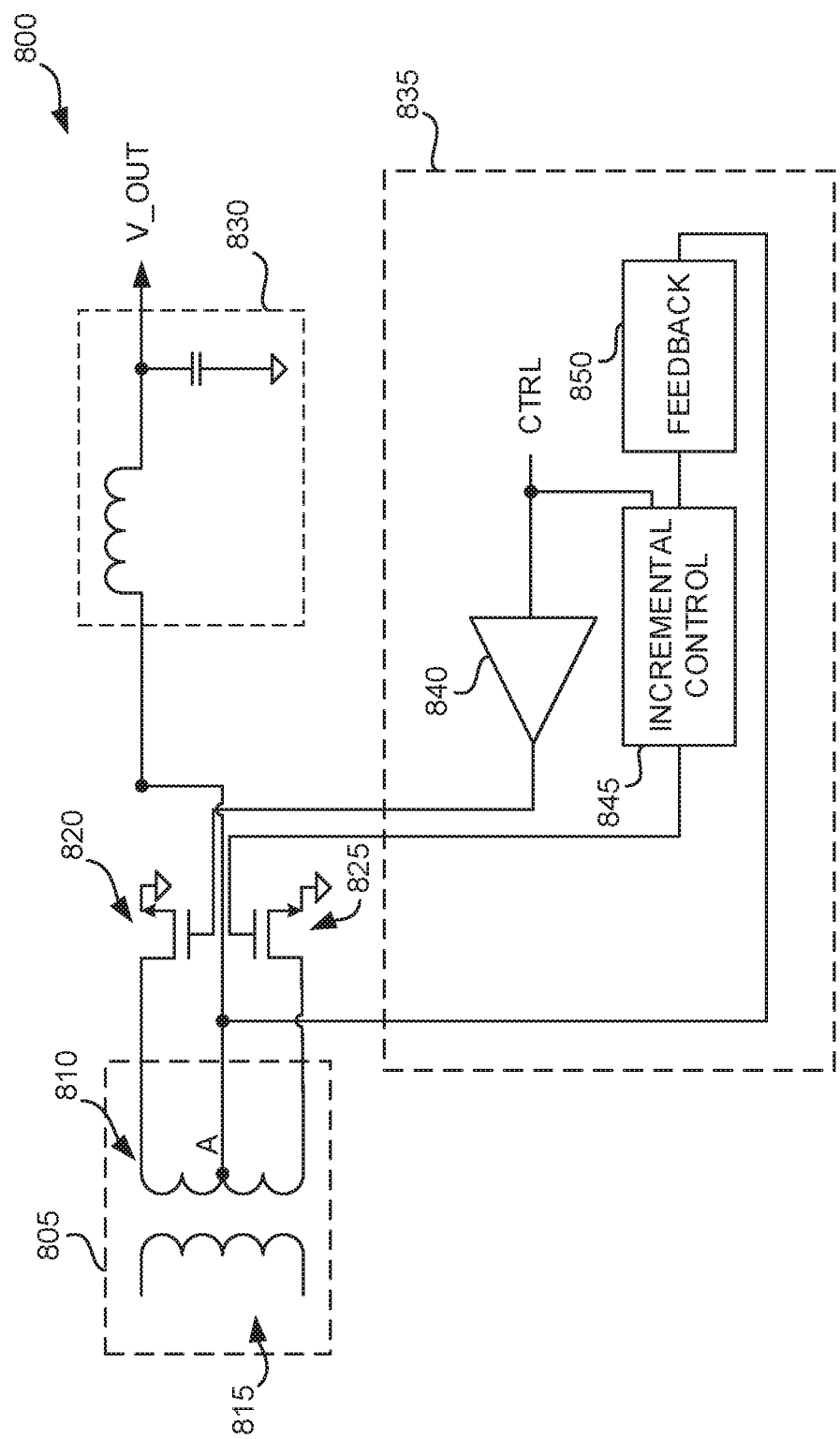
FIG. 8 depicts a diagram of an example of a device that is configured to reduce common-mode electromagnetic interference in a circuit coupled to a secondary winding of a transformer using sampling feedback and incremental control, according to various examples.

In some examples, the H-Bridge control circuit 720 can indicate which delay lines to incrementally update, such as based on the switching cycle. In some examples the delay update circuit 725 can include one or more up/down counters for storing an incrementally updatable value to incrementally adjust delay, control circuits 710 and 745, FIG. 8 depicts a diagram of an example of a device 800 that is configured to reduce common-mode electromagnetic interference in a circuit coupled to a secondary winding 810 of a transformer 805 using sampling feedback and incremental control, according to various examples. The device 800 can include an example of a synchronous, switched, or active, rectifier. In some examples, the device 800 includes the transformer 805, switches 820 and 825, output circuit 830, and control circuit 835. The primary winding 815 of the transformer 805 can be driven by a switch mode power circuit, such as the device 100 (FIG. 1) or any of the other switch mode power circuits shown or discussed in FIGS. 2-7, to induce or generate a voltage or current (hereinafter, "regulated supply") in the secondary winding 810. The switches 820 and 825 can be operated to rectify the regulated supply, such as by alternatively switching on and off during a charge and discharge cycle of the secondary winding 810. The rectified output of the switches 820 and 825 can be provided to output circuit 830.

The control circuit 835 can include any of the examples of the incremental control, feedback, and driver circuits shown, or discussed in association with, FIGS. 1-7. In some examples, control circuit 835 is configured to control the switching operation of switches 820 and 825 to synchronize the switching of each switch with the charge-discharge cycle of the secondary winding 810. Such control can include turning off the switch 825 while turning on the switch 820 during a first part of charge-discharge cycle of secondary winding 810 to enable a current flowing in a first direction through the secondary winding to flow through the switch 820 to (or from) the output circuit 830. Such control can also include turning off the switch 820 while turning on the switch 825 during a second part of charge-discharge cycle of secondary winding 810 to enable a current flowing in a second direction through the secondary winding to flow through the switch 825 to (or from) the output circuit 830. In some examples, the control terminal of the switch 820 is driven by driver circuit 840 (e.g., an example of the driver circuit 105) and a control terminal of the switch 825 can be driven by the incremental control circuit 845 (e.g., an example of the incremental control circuit 125). In certain examples, control terminals of the switch 820 and the switch 825 can both be driven of incremental control circuits, as described herein. In operation, feedback circuit 850 (e.g., an example of the feedback circuit 120) can sample the regulated supply at node A and adjust a drive strength or delay time or incremental control circuit 845 to match or synchronize the switching of switch 820 and switch 825, as described herein. In some examples, the drive strength or delay time of incremental control circuit 845 can be incrementally adjusted to match or synchronize the switching of switch 820 and switch 825 with to the switching or one or more switches coupled to the primary winding 815.

Figure 9:
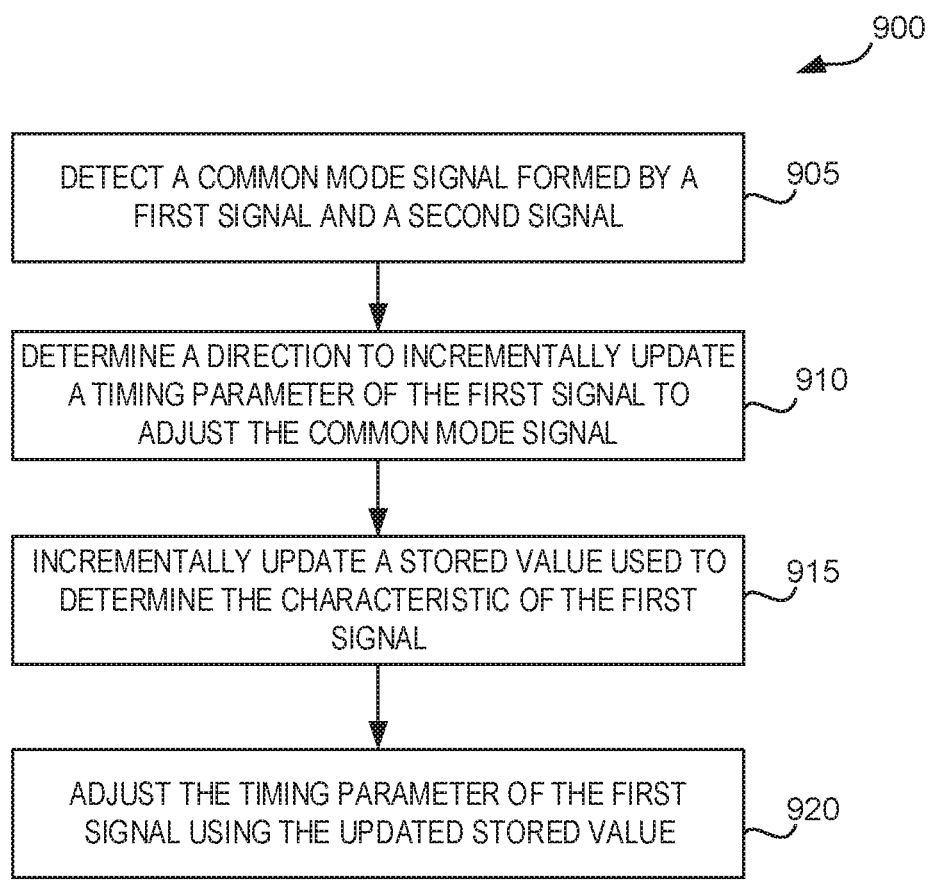
FIG. 9 depicts a flowchart of a set of operations for reducing common-mode electromagnetic interference using sampling feedback, according to various examples.

FIG. 9 is a flowchart that depicts a set of operations for a process 900 for controlling or reducing common-mode electromagnetic interference using sampling feedback, according to various examples. The process 900 can be executed, such as by a system including one or more digital or analog circuits, to perform or implement any of the techniques described herein. In some examples the process 900 can be executed during one or more switching cycles of a switch mode power circuit, such as to reduce common-mode EMI caused by variations in a common-mode voltage in an inductive element, such as a transformer, of the switch mode power supply. At 905, the system can detect a common-mode signal formed by timing or voltage differences between a first signal and a second signal applied across an inductive element. At 910, the system can determine a direction to incrementally update a timing parameter of the first signal to adjust the common-mode signal by reducing the timing or voltage difference between the first signal and the second signal. At 915, the system can incrementally update a stored binary value for controlling the timing parameter of the first signal based on the determined update direction. At 920, the system can adjust the timing parameter of the first signal using the updated stored value.

Aspects or examples of the present disclosure discuss incremental control or incremental updating. As used herein, the term incremental control or incremental updating can include updating by a fixed value, such as by incrementing the value of a counter. The term incremental control or incremental updating can also include updating by a value at least once in a cycle over a set or sequence of one or more cycles. The term incremental control or incremental updating can also include updating the value of a counter at a frequency of less than once a cycle over a set or sequence of one or more cycles, such that more than one cycle elapses between updates.

Aspects or examples of the present disclosure discuss a weighted gate driver, a weighted delay circuit, or other weighted components. As used herein, the term weighted includes using a numeric value or any other signal that can take on one or more values, to determine or adjust the operation of a circuit, such as a gate driver or delay circuit. The term weighted can include any form of encoding information in the numeric value or other signal, such as binary and unary encoding. The term weighted is not limited to any particular encoding technique.

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the inventive subject matter should be determined with reference to the appended claims, along with the full scope of equivalents to which such claims are entitled.

The claimed invention is:

1. A switch mode power circuit to control a common-mode signal, the switch mode power circuit comprising:
  a first switch and a second switch configured to establish switch mode voltage or current between a first node and a second node; and
  a feedback circuit configured to:
    detect common-mode voltage signal generated at the first node and the second node by a first signal generated by the first switch and a second signal generated by the second switch; and
    incrementally adjust a timing parameter of the first signal to adjust the common-mode voltage signal, wherein the timing parameter of the first signal includes one of a slew rate or a delay of the first signal; and
  wherein the feedback circuit comprises a memory circuit, including a binary counter, to store a value to control the timing parameter of the first signal, and an evaluation circuit, including a comparator, to incrementally update the stored value based on the detected common-mode voltage signal, and wherein the feedback circuit is configured to: (1) determine, by the comparator at an indicated time in a switching cycle of the switch mode power circuit, a difference between the first signal and the second signal; and (2) increment or decrement a count stored in the binary counter, based on the determined difference.

2. The switch mode power circuit of claim 1, wherein:
  the timing parameter of the first signal is the slew rate of the first signal;
  the feedback circuit comprises a weighted gate driver circuit; and
  to adjust the timing parameter of the first signal, the weighted gate driver circuit is configured to use the value stored in the memory circuit to adjust the slew rate of the first signal.

3. The switch mode power circuit of claim 2, wherein the weighted gate driver circuit is configured to use the value stored in the memory circuit to adjust the slew rate of the first signal by adjusting a control signal used to drive the first switch.

4. The switch mode power circuit of claim 2, wherein the weighted gate driver circuit comprises a drive transistor having an adjustable effective width, and the weighted gate driver circuit is configured to use the value stored in the memory circuit to adjust the slew rate of the first signal by adjusting the effective width of the drive transistor.

5. The switch mode power circuit of claim 1, wherein:
  the timing parameter of the first signal comprises the delay in the first signal;
  the feedback circuit comprises a weighted delay circuit; and
  to adjust the timing parameter of the first signal, the weighted delay circuit is configured to use the value stored in the memory circuit to adjust the delay in the first signal.

6. The switch mode power circuit of claim 1, further comprising a load circuit, the load circuit comprising an inductive element that is coupled to the first node and the second node.

7. The switch mode power circuit of claim 1, wherein the switch mode power circuit further comprises a bridge converter comprising a transformer, and the first switch is a pull-down switch that is coupled to a first terminal of a winding of the transformer at the first node and the second switch is a pull-up switch that is coupled to a second terminal of the winding of the transformer at the second node.

8. The switch mode power circuit of claim 1, further comprising a switched rectifier, wherein:
  the switched rectifier comprises a transformer;
  the first switch is coupled to a first terminal of a first winding of the transformer;

the second switch is coupled to a second terminal of the first winding of the transformer; and a second winding of the transformer being configured to induce a switch mode voltage or current in the first winding of the transformer.

9. A device having a circuit for reducing common-mode electromagnetic interference, the circuit comprising:

a first inductor having a first terminal and a second terminal;

a second inductor coupled to a power supply, the second inductor configured to induce a voltage or current in the first inductor;

a first switch circuit coupled to the first terminal at a first node and a second switch circuit coupled to the second terminal at a second node, wherein the first switch circuit is a pull-down circuit that is configured to drive the first node to a negative voltage relative to the second node and the second switch circuit is a pull-up circuit that is configured to drive the second node to a positive voltage relative to the first node;

a driver circuit configured to control a switching characteristic of the first switch circuit; and a feedback circuit coupled to the first node and the second node, the feedback circuit comprising:

a storage circuit, including a binary counter circuit, that is configured to provide an input to the driver circuit; and a comparator circuit that is configured to incrementally update the binary counter circuit based on a difference between a first signal at the first node and a second signal at the second node to reduce a common mode voltage in the first signal and the second signal.

10. The device of claim 9, wherein the driver circuit comprises a binary weighted gate driver circuit.

11. The device of claim 9, wherein the storage circuit comprises a delay line control circuit and the driver circuit comprise a delay line circuit.

12. The device of claim 11, wherein the comparator circuit is configured to:

compare a reference signal to an average of the first signal and the second signal; and incrementally update the storage circuit based on a result of the comparison.

13. A method for reducing common-mode electromagnetic interference in a power converter, the method comprising:

detecting a common-mode voltage signal across an inductive element during actuation of a switching circuit that is configured to drive the inductive element, the detecting the common-mode voltage signal including determining, by a comparator at an indicated time in a switching cycle of the switching circuit, a difference between a first signal at a first terminal of the inductive element and a second signal at a second terminal of the inductive element;

determining, based on the determined difference, an update direction to update a stored value in a binary counter of a memory circuit that is used to determine a timing parameter of the switching circuit, wherein the timing parameter of the first signal includes one of a slew rate or a delay of the first signal;

incrementally updating the stored value based on the determined update direction, including by incrementing or decrementing a count stored in the binary counter of the memory circuit based on the determined difference; and adjusting the timing parameter based on the updated stored value.

14. The method of claim 13, wherein the timing parameter is the slew rate of the switching element.

15. The method of claim 13, wherein the timing parameter is the delay to an actuation time of the switching element.

* * * * *